(12) United States Patent
Goupil et al.

(10) Patent No.: US 10,886,139 B2
(45) Date of Patent: Jan. 5, 2021

(54) METHOD OF ETCHING ONE OR MORE OF MIXED METAL AND DIELECTRIC LAYERS OF A SEMICONDUCTOR DEVICE

(71) Applicants: TESCAN Brno, s.r.o., Brno (CZ); ORSAY Physics, Fuveau (FR)

(72) Inventors: Gregory Goupil, Trets (FR); Sharang, Brno (CZ); Jan Brulik, Brno (CZ)

(73) Assignees: TESCAN Brno, s.r.o., Brno (CZ); ORSAY Physics, Fuveau (FR)

( * ) Notice: Subject to any disclaimer, the term of this patent is extended or adjusted under 35 U.S.C. 154(b) by 0 days.

(21) Appl. No.: 16/500,464

(22) PCT Filed: Apr. 4, 2017

(86) PCT No.: PCT/CZ2017/000021
§ 371 (c)(1),
(2) Date: Oct. 3, 2019

(87) PCT Pub. No.: WO2018/184602
PCT Pub. Date: Oct. 11, 2018

(65) Prior Publication Data
US 2020/0043743 A1    Feb. 6, 2020

(51) Int. Cl.
*H01L 21/311* (2006.01)
*H01L 21/3105* (2006.01)
(Continued)

(52) U.S. Cl.
CPC .. *H01L 21/31116* (2013.01); *H01L 21/31055* (2013.01); *H01L 21/32115* (2013.01);
(Continued)

(58) Field of Classification Search
CPC ........... H01L 21/31116; H01L 23/5283; H01L 23/5226; H01L 21/7684; H01L 21/76819;
(Continued)

(56) References Cited

U.S. PATENT DOCUMENTS 6,900,137 B2   5/2005   Herschbein et al.
7,008,803 B2   3/2006   Kane et al.
(Continued)

OTHER PUBLICATIONS

European Patent Office, International Searching Authority, International Search Report, dated Nov. 23, 2017, in International Application No. PCT/CZ2017/000021, filing date Apr. 4, 2017.
(Continued)

*Primary Examiner* — Duy Vu N Deo
(74) *Attorney, Agent, or Firm* — Thedford I. Hitaffer; Hitaffer & Hitaffer, PLLC

(57) ABSTRACT

A method performs a planar and cross-sectional etching of semiconductor devices made up of multiple layers of dissimilar materials, like metals and dielectrics. The method results in the removal of multiple layers with the aim of either exposing a single layer of interest or cross-sectioning several layers to perform various applications including but not limited to, nanoprobing, circuit edit and failure analysis. The method comprises directing an ion beam toward a defined area on the semiconductor device in the presence of an etching agent, thereby removing at least a portion of the mixed metal and dielectric layer and producing a recess with at least one substantially smooth and planar surface in the milled area. The used etching agent comprises oxidizing and reducing elements in a ratio optimized such that the quantity of oxidizing elements is one element more than the quantity of reducing elements.

13 Claims, 11 Drawing Sheets

(51) Int. Cl.
*H01L 21/321* (2006.01)
*H01L 21/3213* (2006.01)
*H01L 21/768* (2006.01)
*H01L 23/522* (2006.01)
*H01L 23/528* (2006.01)

(52) U.S. Cl.
CPC .... *H01L 21/32136* (2013.01); *H01L 21/7684* (2013.01); *H01L 21/76819* (2013.01); *H01L 23/5226* (2013.01); *H01L 23/5283* (2013.01)

(58) Field of Classification Search
CPC ......... H01L 21/32136; H01L 21/32115; H01L 21/31055; H01L 21/30621
See application file for complete search history.

(56) References Cited

U.S. PATENT DOCUMENTS

| | | | |
|---|---|---|---|
| 9,064,811 B2 | 6/2015 | Rue et al. | |
| 2005/0072756 A1* | 4/2005 | Makarov | C23F 4/00 216/63 |
| 2008/0113455 A1* | 5/2008 | Jain | H01L 21/31116 438/8 |
| 2011/0048931 A1 | 3/2011 | Makarov | |
| 2012/0211356 A1* | 8/2012 | Makarov | C23F 4/00 204/192.34 |
| 2013/0118896 A1 | 5/2013 | Foster et al. | |

OTHER PUBLICATIONS

European Patent Office, International Searching Authority, Written Opinion, dated Nov. 23, 2017, in International Application No. PCT/CZ2017/000021, filing date Apr. 4, 2017.

* cited by examiner

METHOD OF ETCHING ONE OR MORE OF MIXED METAL AND DIELECTRIC LAYERS OF A SEMICONDUCTOR DEVICE

CROSS-REFERENCE TO RELATED APPLICATIONS

This application, filed under 35 USC 371, is a United States National Stage Application of International Application No. PCT/CZ2017/000021 filed Apr. 4, 2017, the disclosure of which is incorporated herein by reference.

FIELD OF THE INVENTION

The present invention relates to a method for gas-assisted etching of dissimilar materials by ion beam irradiation and is applicable, for example to uniform removing of metal and dielectric material for creating smooth and planar surface on semiconductor device.

BACKGROUND OF THE INVENTION

Etching is a well-known technique in semiconductor industry which is used for removal of material from semiconductor devices. The purpose of the removal is to extend accessibility of interesting areas. The etching process may have two modes. The first mode is a so called planar etching or deprocessing contains a layer-by-layer removal of thin layers to the die of the semiconductor device. The second mode is called cross-section etching and produces a recess in the semiconductor device in which the cross-section of more layers may be observed. The etching is a frequently employed technique in semiconductor industry and also by material analysis groups in research institutes and universities. Commercially etching may be performed by reactive ion etching, wet chemical etching or mechanical etching comprise polishing or cutting. Out of these, mechanical etching is the most common technic used for large area removal of metal and dielectrics mixed or not. Mechanical etching approach is very abrasive, with a likely formation of slurry sitting between layers of the device and so requiring additive cleaning procedures. The surfaces obtained with mechanical etching are generally non-planar surfaces with an apparent gradient at the surface and a poor reliability in term of small structures localization. With the nature of the semiconductor devices growing more sensitive to these side-effects are likely to fail through precise defect localization, nanoprobing, C-AFM measurements, circuit edit or any other electrical tests.

Mechanical etching may be replaced with much more precise advanced instruments like a focused ion beam device or broad ion beam device which may perform etching in a localized fashion. Nearby area is almost unaffected or the effect is only in the range of few micrometers. The ion beam device creates a stream of ions targeting with great accuracy a pre-chosen area to sputter atoms from the sample. Ion Beam (IB) when scanning over a given area modifies a sample in different ways, depending on the energy of the incoming ions. Ion beam devices employ a variety of ions from He to Xe, usually differentiated by their mass and consequently their interaction with the target surface.

The process of material removal is controlled as it can be easily monitored online by collecting signal from the sputtered ions using different detectors in a FIB-SEM system. Further widening the application base of FIB-SEM systems, gas assisted etching (GAE) techniques are now widely employed.

The "maze" like geometry of the conductive metal lines running through the dielectric material in semiconductor device stacked in 3-dimensions makes planar etching and cross-section etching more challenging when only the FIB is used. FIB interactions with a sample surface are different depending on the composition and/or the crystallinity of the targeted surface. This leads to pre-determination in sputtering rates for every material using the same set of FIB conditions. These interactions can be modified when reacting molecules are introduced as etching agent in the form of gas or vapor using a gas injection system (GIS) in the working area. The basic principle of this method is the introduction of a gas containing suitable chemical form of the desired material into the sample chamber. When injecting this favorable chemical gas agent into the chamber during the etching of two or more dissimilar materials can enable sputtering at equal rates leading to a smooth planar surface.

Two main reactions may generally be observed when introducing the gas near the sample surface: surface modification via etching and material deposition. Gas assisted etching can be used for either modifying the etching behavior of certain materials because of the presence of gases or the gas agents under the ion beam enables deposition of precursor material onto the target surface. With a reactive gas as an etching agent under the influence of beam can help increase or decrease the etching rates of some materials due to the localized chemical reactions. On one hand, when volatile species are formed, the sputtering rate Is increased and less material redeposition is observed. On the other hand, harder layers can also be created by the deposition of the gas molecules on to the surface and simultaneous diminution of the sputtering rate is observed. Such diversified applications of the sputtering rate are exploited to perform selective etching or planar etching on semiconductor devices. With a reactive etching agent, the ion beam etching due to the ion beam can be enhanced or reduced due to local chemical reactions.

The U.S. Pat. No. 6,900,137 uses $XeF_2$ to etch both organic dielectric and metal layer in a controlled manner by increasing the dwell times of the FIB.

U.S. Pat. No. 7,008,803 is using GAE with variable position endpoint detector to determine the dwell time of single point etching until the end of etched layer.

In patent application 2013/0118896 FIB is used for homogenous removal of dissimilar materials using a rotating sample stage and an adjustment of the FIB operating conditions during the process. This method needs a precise control of the etching rate of each material present at the sample surface and the number of parameters that needs to be controlled during the milling. It requires producing hierarchical circuit schematics for each sample using the acquired surface data from each removed layer.

In U.S. Pat. No. 9,064,811 is reported a group of etching agents for GAE causing the equal etching rate of dissimilar material by slowing down etching rate of dielectric compared to metallic compounds which are selected from the group containing acetate/nitroacetate and short hydrocarbons chain. Patent specifically enlists methyl acetate, ethyl acetate, ethyl nitroacetate, propyl acetate, propyl nitroacetate, nitro ethyl acetate, methyl methoxyacetate or methoxy acetylchloride as the agents for GAE.

Semiconductor industry is growing at a very fast pace with newer challenges with each passing day. Materials employed, more and more complex architectures with constant need to further miniaturization to increase the number of transistors in smaller areas and so the diminution of their size turned exponentially the condensed density of the circuits. Although, in the references cited above, different methods for producing planar surface using ion beam device are discussed, there is a wide variety of etching agents which can be used for planar etching even more regarding the increasing number of material constituting the next generation of semiconductor devices as well as the architecture used for the circuits. Many methods can suited for etching a given set of metal-dielectric combination and be more effective than using a FIB alone on other combinations, while keeping the unwanted side effects like redeposition from the gas by-products to bare minimum.

Some of them may be etched using existing GAE methods. It is more effective to have a variety of etching agents in selection to choose the one with the best performance for the method of etching dissimilar materials with approximately the same etching rates.

SUMMARY OF THE INVENTION

The method described hereunder uses selected etching agents for semiconductor material removal from thick copper layers directly exposed after de-capping to a very thin dense copper layers which are just above the transistor contact layer ($TC_L$). It is often required that during etching, dissimilar materials should have the same etching rates. The selected etching agent must include enough oxidizing elements to adjust etching rate of metal and enough reducing elements to adjust the etching rate of dielectric to the level where both dissimilar materials are etched at approximately the same etching rate.

The presence of a high energy ion beam (IB) such as focused ion beam or broad beam with a beam energy of at least, 5 keV, together with the etching agent and semiconductor device produces reactive elements by breaking the inter-elemental bond of compounds in the working chamber especially in the active ion beam area. The active ion beam area is the area along the trajectory of the ion beam and in the space where the ion beam reaches the surface of the semiconductor device. These reactive elements associated with the large amount of electrons produced by the interaction of the ion beam with either the sample surface or with etching agent may react with the constitutive elements and form other molecules. To create a volatile compound favoring etching, the GIS must deliver an etching agent or combination of etching agents containing elements necessary to produce a targeted volatile compound. For better control of the simultaneous milling of dissimilar materials containing metal and dielectric, a suitable combination of the surface composition and the elements introduced by the GIS must be found in order to allow the desired surface reactions. The elements required to create volatile molecules may contain carbon (C), oxygen (O), halogenated elements like flourine (F) and chlorine (Cl) and nitrogen (N). Simultaneous etching of the metallic constitutive-elements of the semiconductor device must be considered along with etching of the dielectric which must also be controlled to obtain specified delayered-surface roughness. This dielectric may have varied compositions consisting of more elements since the most common dielectrics are the SiOx and SixNy types. Up to now; carbon is added in as a named low-k dielectric such as potential substrates based on GaAs or GaN materials. The metal used in semiconductor device may be copper, cobalt, aluminum, tungsten, and tantalum. When sputtered from the sample and ejected by the ion beam interaction with the dielectric, the amount of reactive molecules from dielectric milling increases. Without the presence of complementary molecules brought in by a GIS, similar to metal etching (as described above), it is difficult to control their milling rate. Thus, to reach a controlled etching rate with an approximately 1:1 ratio between all the constitutive elements of a selected sample, the etching rate of all materials with and without the addition of chemistry must be taken into account. The etching agent used for GAE may include oxidizing elements with one or several different chemical functionalities using nitrogen, oxygen and halogen (F, Cl) and a reduction element preferably in the form of carbon. Nitrogen is required to produce volatile metal-nitrogen molecules such as copper nitride. Halogens are required to produce metal-halides or silicon halides. Oxygen may be used to produce volatile COx molecules with C-contained in low-k dielectric. This volatile molecule formation will aid their pumping out of the chamber, thus decreasing the redeposition of by-products generated during GAE using ion beam.

The ratio of all these injected elements must be controlled, considering the sample composition, to reach a level of surface uniformity and roughness of the final layer. The chemical compounds in agreement with the invention from which the etching agent is selected comprise —COO—, —CON—, or —CNN— core structure in combination with other elements according to the requirement for oxidation/reduction ratio (oft), The etching according the invention may be a planar etching where the substantially planar surface made by ion beam is parallel to the metal or dielectric layers in the semiconductor device or a cross-section etching where the substantially planar surface is offset to the metal or dielectric layers in range of 10-170°.

Based on this approach for etching of dissimilar materials such as metal and dielectrics, the amount of oxidizing (o) and reducing (r) elements present in the etching agent should be balanced. The best ratio for etching of dissimilar materials was determined as: [o=r+1], preferably 3 oxidizing and 2 reducing elements for the most common combinations of dielectric and metal such as silicon dioxide and copper. With an increasing number of reducing elements in the etching agent it is more difficult to predict the amount of reactive fragments and to ensure their gaseous character in working chamber. The number of reducing elements in the etching agent ensuring the appropriate function is up to 3 but also the etching agents with a higher number of reducing elements may have required properties. Reducing elements in the etching agent must be C and oxidizing elements must be selected from the group of F, Cl, O and N. In a preferred embodiment, the etching agent may comprise one chemical compound from a group: Ammonium ethanoate, Chloroacetamide, Fluoroacetamide, Methyl Carbamate, N-Nitrosodiethylamine.

In further embodiment according to the invention, the etching of a semiconductor device may release a large number of secondary oxidizing and reducing elements from the semiconductor device into the working chamber. These secondary oxidizing and reducing elements may significantly contribute to the etching process and would as such affect the total amount of oxidizing and reducing elements that would need to be introduced via the GIS during etching. If the number of secondary elements is high enough for causing element disproportion influencing the etching process and/or tends toward non-uniform etching of dissimilar materials, the composition of the etching agent or mixture of etching agents needs to be adjusted. Good adjustment of dissimilar material etching performance was observed for etching agents or mixture of etching agents with the number of elements in etching agent within a range from [o−r=−1]

to [o–r=3]. If the etching of copper is faster than the dielectric, more reducing elements need to be included. Likewise, if the etching of dielectric is faster than copper more oxidizing elements are required. The non-uniform etching ratio may be adjusted by the etching agent containing one compound from: Acetic Acid, Ethyl Formate, Ammonium Bicarbonate, Hydrazine Acetate, Diethyl imidodicarbonate, Ammonium Oxalate and water. The etching process may be monitored online or in intervals with SEM or FIB device equipped with appropriate signal detection device and method.

In preferred embodiments, the mixture of etching agents comprises at least first etching agent from: Ammonium ethanoate, Chloroacetamide, Fluoroacetamide, Methyl Carbamate, N-Nitrosodiethylamine and at least one second etching agent from: Acetic Acid, Ethyl Formate, Ammonium Bicarbonate, Hydrazine Acetate, Diethyl imidodicarbonate and water.

In a further embodiment in line with the invention, the etching agent contains an R—CO—R core structure. The R in the formula may comprise any of the elements which together with the core structure fulfill the conditions of the ratio of oxidizing and reducing elements. The R—CO—R structure contains a strong C—O double covalent bond and other inter-elemental bonds e.g. C—H, C—C, C—NH2 which have lower bonding energy than the C—O double covalent bond. The molecules may be fragmented in the gas phase by high energy collision induced dissociation (CID). In typical CID, the molecular ions are usually accelerated to high kinetic energies by an electrical potential and then allowed to collide with neutral molecules (often helium, nitrogen or argon). In an embodiment according to the invention, the neutral etching agent molecules collide with high kinetic energy ion beam ions. The energy from the collision may be converted into internal energy which results in bond breakage and fragmentation of the etching agent into smaller fragments. The amounts of fragments typically increase with the acceleration energy of ions and their mass. When the energy of ion beam decreases to the low energy area (<5 keV), the amount of reactive elements decrease and volatile molecules as such C—O molecules may arise in the working chamber. These molecules may remain intact and do not significantly contribute to the inter-elemental reactions. When the total amount of reactive elements is decreased the etching rate is slowed down. Slowing down the etching rate together with lower penetration of surface of the semiconductor device may results in fine etching of the sample surface without the need to change the etching agent composition, concentration or injection pressure. Modern ion beam devices are capable of rapidly changing the beam energy, and thus it is possible to have very fast change between the normal dissimilar materials etching to very fine dissimilar material etching. This is beneficial for combined removal of the thick upper metal layers of a semiconductor device and the very dense lower semiconductor device metal layers or for better control of the end-point detection if the etching process is too fast.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE EMBODIMENTS

The embodiment of invention is a method for performing planar and cross-section etching by removing multiple layers of dissimilar materials like metals and dielectrics aiming to expose a single layer of interest or cross-sectioning several layers to perform various applications including but not limited to, nanoprobing, circuit edit and failure analysis.

Preferred embodiments of the present invention are directed to a method used for etching dissimilar materials used in the production of semiconductor devices. The utilization of the technique and the apparatus can be duplicated for uniform and smooth etching of dissimilar materials like copper, low-k dielectrics, GaAs, and GaN and others. The method is flexible and can be adapted as standalone or used in combination with other methods for enhanced productivity of etching or expedite techniques for probing analysis.

Figure 1:
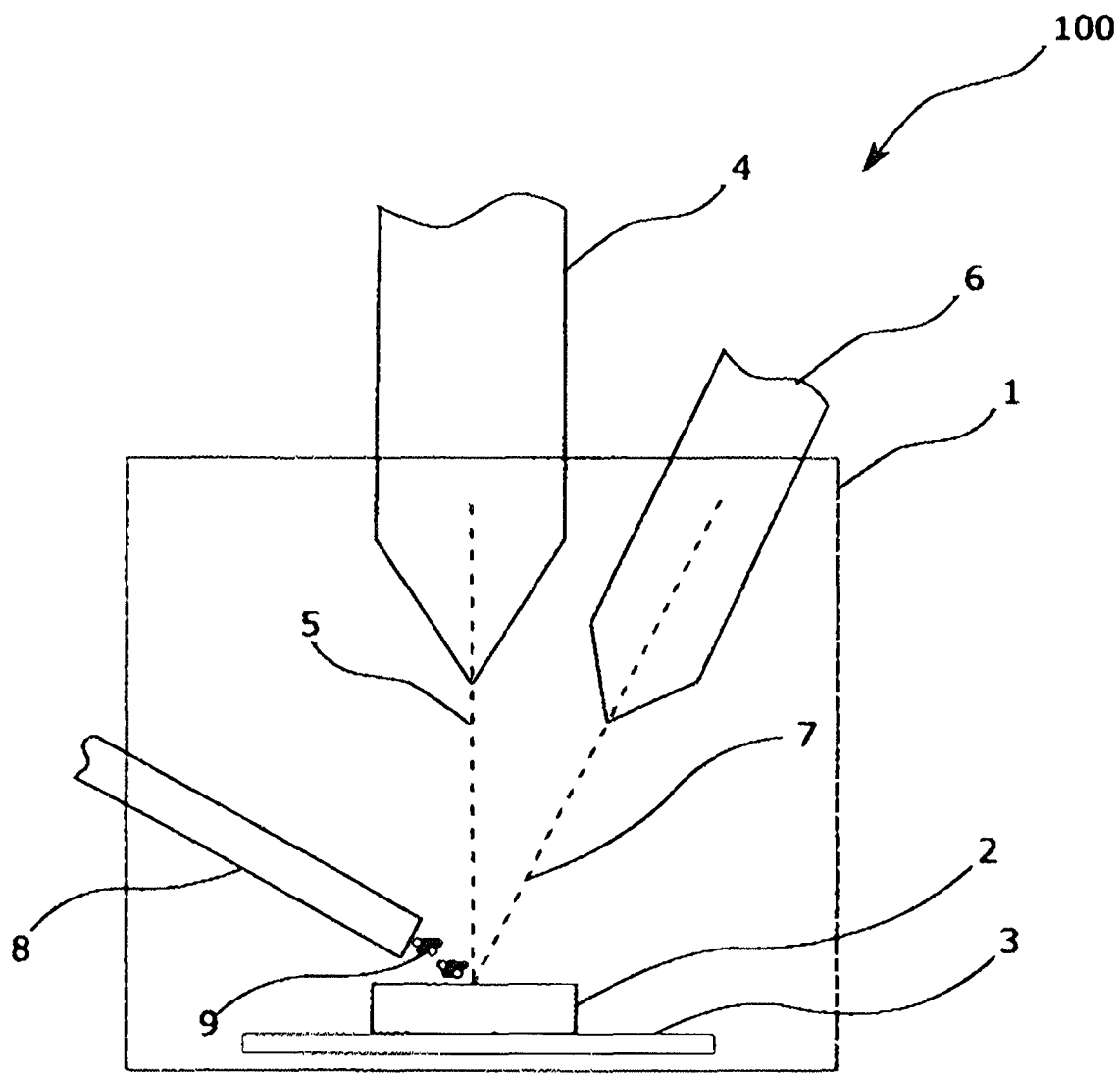
FIG. 1 is a schematic view of device for performing the preferred embodiment of the invention

FIG. 1 is a schematic view of device 100 for semiconductor device 2 etching. The device comprises a vacuum chamber 1 in which the semiconductor device 2 is placed on a holder 3. The device further comprises means 4 for generating ion beam and propagating the ion beam along an optical axis 5 towards the semiconductor device 2. Ion beam may employ a variety of ions from light Li to relative heavy Xe ions. The device 100 may further comprise SEM 6 for generating and propagating electrons along the SEM optical axis 7. SEM optical axis 7 aims approximately at the same area on the object as ion beam optical axis 5. Electrons scattered from the sample or electrons generated by the object after interaction with SEM 6 electrons are used for monitoring of the etching progress on semiconductor device 2 surface. The device 100 further comprises a gas Injection system 8 for propagating gas molecules of the etching agent 9 towards the semiconductor device 2.

Figure 2:
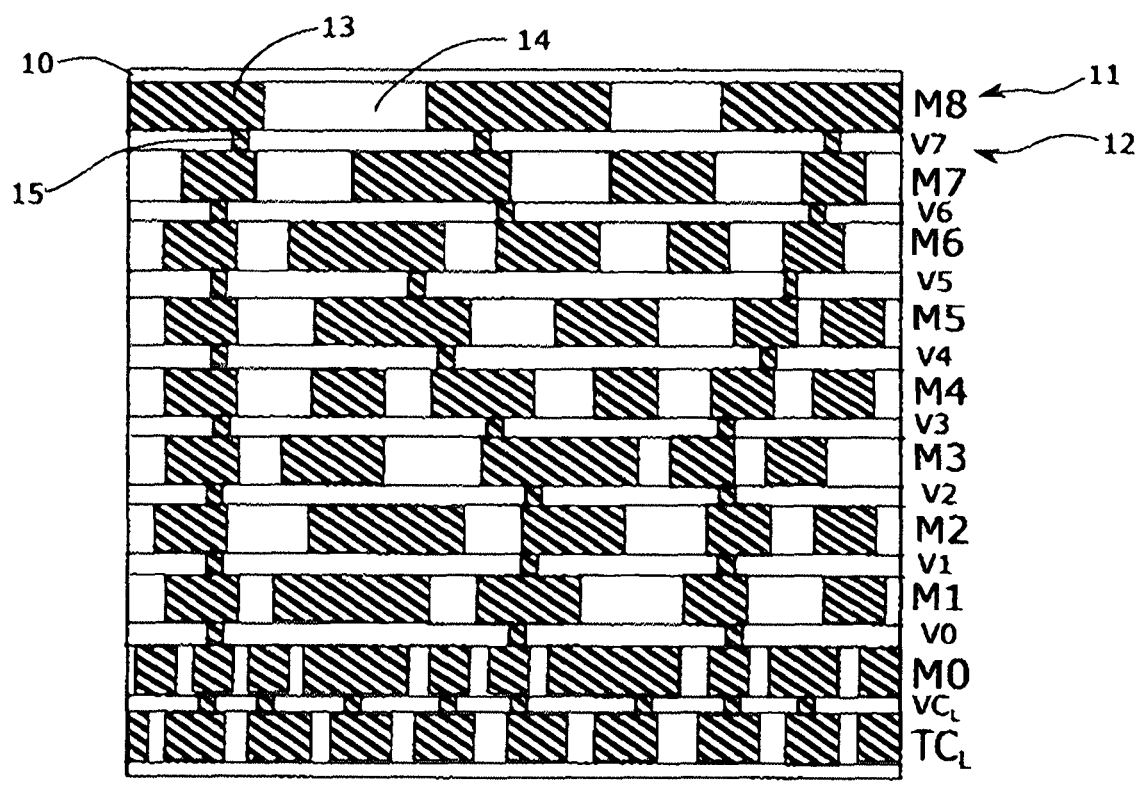
FIG. 2 is a cross-sectional view showing schematically a portion of a typical semiconductor device.

FIG. 2 shows a cross-section view of the semiconductor device 2. Semiconductor device 2 consists of multiple layers. On the top of the semiconductor device 2 is a capping layer 10. Semiconductor device 2 further comprises metal layers 11 labeled as M0 to M8. Each metal layer 11 comprises metal conductors 13 (running through the metal layer 11) and low-k dielectrics 14. Via layers 12 labeled as V7 to $VC_L$ connect the metal conductor 13 from one metal layer 11 via the interconnect conductors 15 to the metal conductor 13 in next metal layer 11 and are placed between metal layers 11. The interconnect conductors 15 are separated within the via layer 12 with dielectrics 14.

Figure 3:
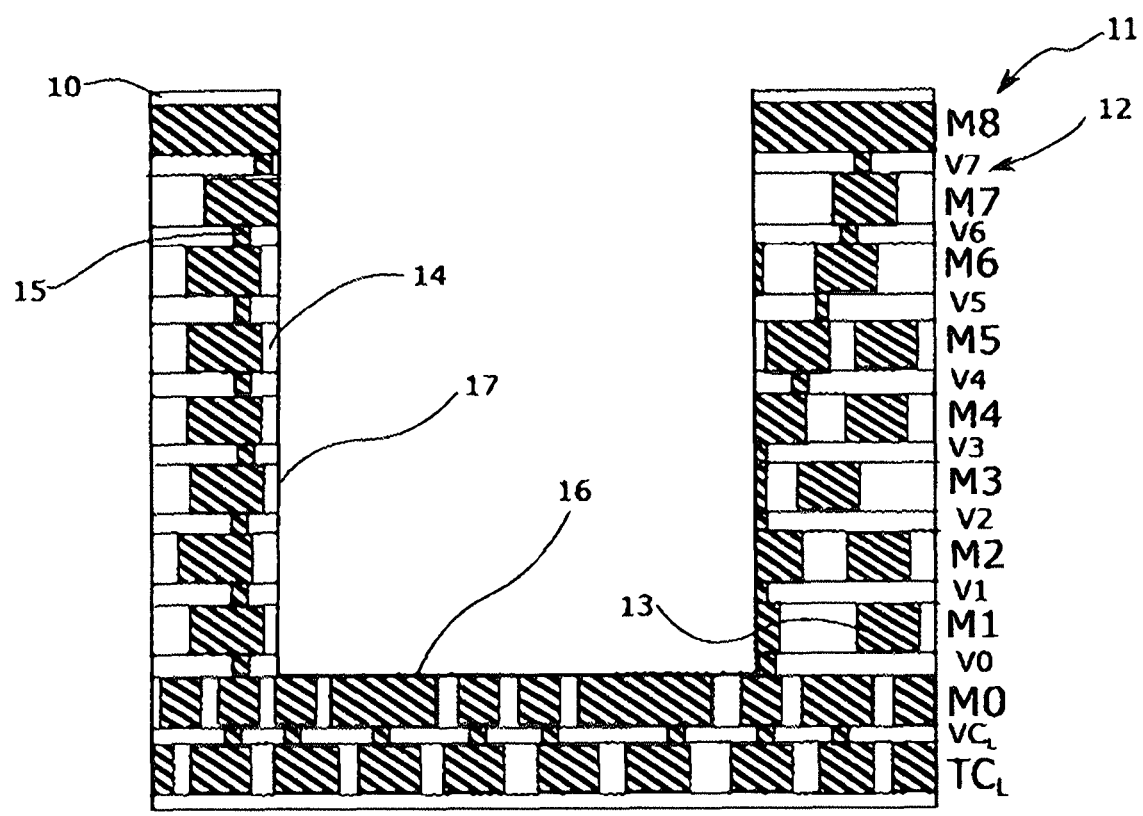
FIG. 3 is a cross-sectional view showing schematically a portion of the semiconductor device after planar etching.

FIG. 3 shows the result of successful planar etching using gas assisted etching in accordance with the invention. Part of the metal layers 11 from M8 to M1 and via layers 12 from V7 to V0 is removed within a defined area and a smooth surface 16 is created on the metal layer 11 M0. The metal layers 11 in the vicinity of the planar etched box defined by the smooth planar surface 16 and the walls 17 of the box are intact. The planar surface area has a dimension of 100×100 micrometers. Due to a clean and smooth etching process the metal conductors 13 of metal layer 11 M0 are accessible for observation and analysis. The removal of metal layers 11 and via layer 12 is a layer-by-layer process and any metal layer 11 or via layer 12 may be prepared for observation and analysis according to this invention by scanning the surface of semiconductor device 2 by ion beam.

Figure 4:
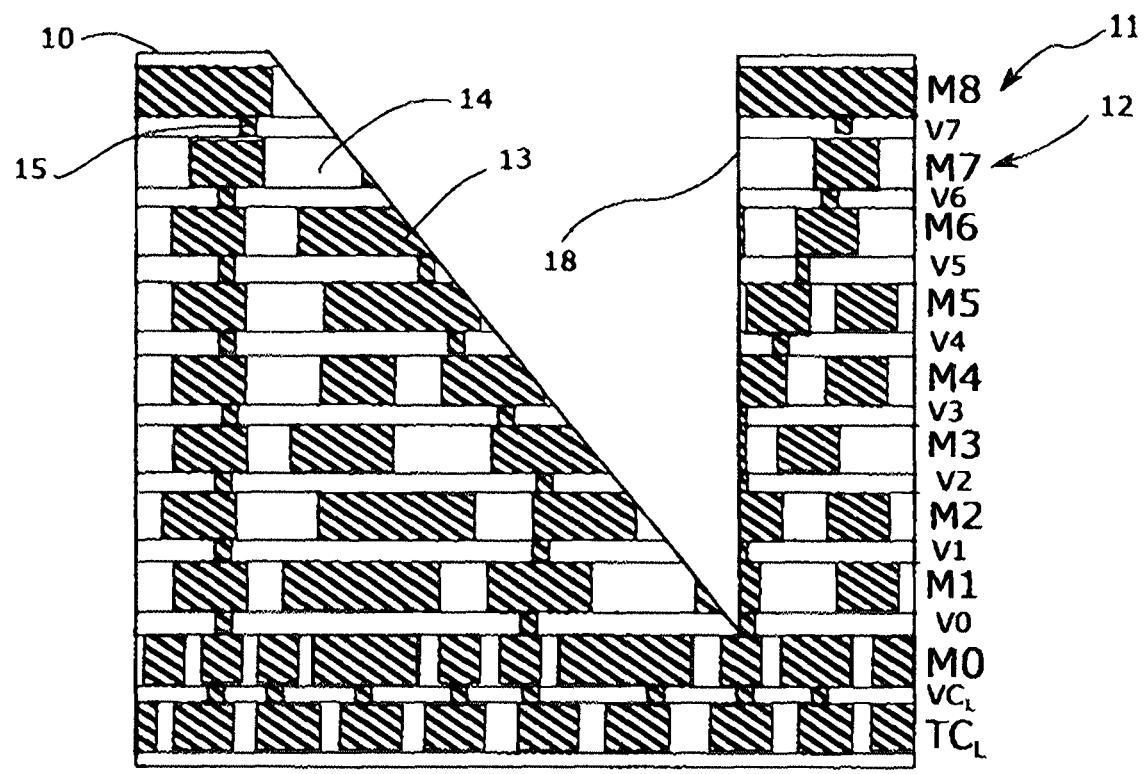
FIG. 4 is a cross-sectional view showing schematically a portion of the semiconductor device after cross-section etching.

FIG. 4 shows the result of successful cross-section etching using gas-assisted etching according to the invention. Compared to FIG. 3, cross-section etching allows observing or analyzing the cross-section surface 18 which is a plane intersects with more than one metal layer 11. Using gas-assisted etching according to the invention enables the etching of dissimilar material such as metal conductors a dielectric 14 and interconnect conductors 15 at the same etching rate and the curtaining effect is thus minimized.

Figure 5:
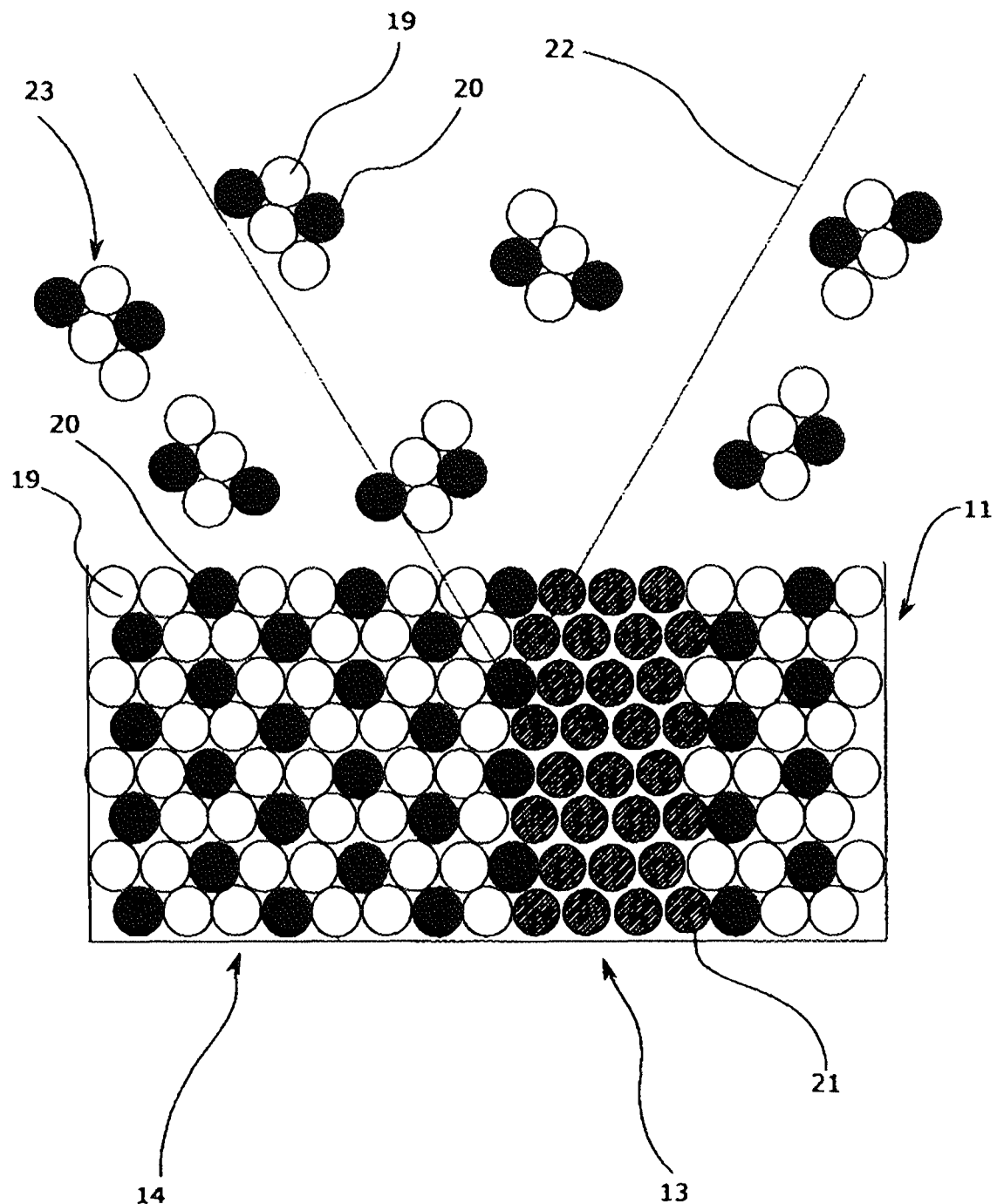
FIG. 5 is a cross-sectional view showing schematically a detail of a portion of the semiconductor device with inactive ion beam

FIG. 5 is a detailed cross-section of one metal layer 11 of semiconductor device 2 about to undergo etching, including dielectric. 14 comprising oxidizing 19 and reducing 20 elements and metal conductor 13 comprising metal elements 21. Active area 22 of the ion beam represents the area where the etched elements will be released first and where etching agent 23 molecules will first come in contact with ion beam active area 22. FIG. 5 shows the situation with inactive ion beam which means no high energy ions are present in active area 22. The etching agent 23 contains oxidizing 19 and reducing 20 elements in the area close to the surface of semiconductor device. The semiconductor device layer also contains oxidizing and reducing elements to complete the reaction amounts. In the preferred embodiment, the etching gas is Methyl Carbamate with a 2:3 ratio of reducing 20 to oxidizing 19 elements. In alternative embodiments, Ammonium ethanoate, Chloroacetamide, Fluoroacetamide, N-Nitrosodiethylamine can be used as etching agent. The etching agents 23 may be used as alone or in combination with any other from this group or in combination with at least one of the group comprising Acetic Acid, Ethyl Formate, Ammonium Bicarbonate, Hydrazine Acetate, Diethyl Imidodicarbonate, and water.

Figure 6:
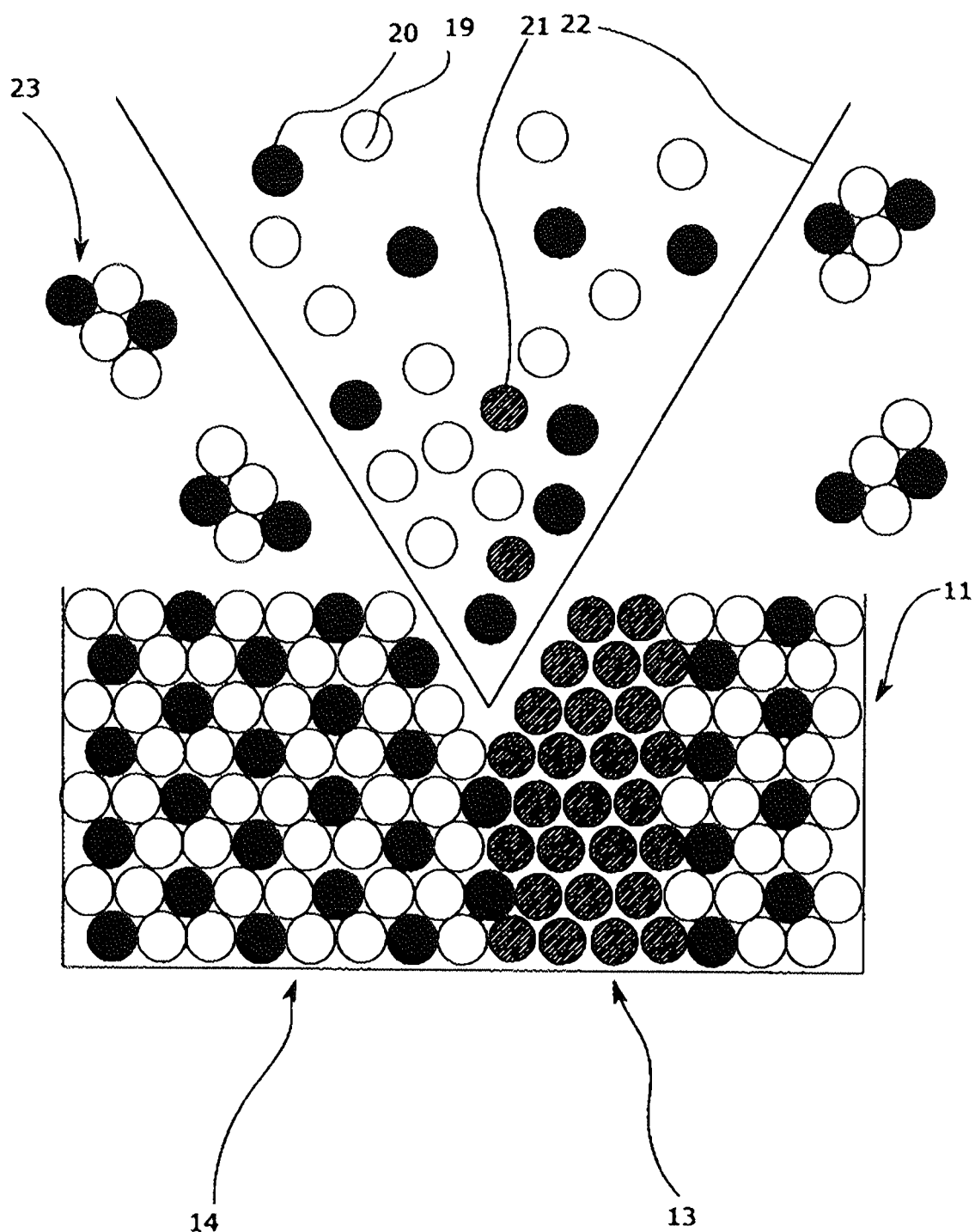
FIG. 6 is a cross-sectional view showing schematically a detail of a portion of the semiconductor device with active high energy ion beam

FIG. 6, in comparison to FIG. 5, shows the situation where ion beam is activated and etches the low-k dielectric 14 and metal conductor 13 present in the metal layer 11 of the semiconductor device 2 with high energy ion beam. The ion beam has energy of at least 5 keV but preferably above 10 keV. The elements 19, 20, 21 from metal layer 11 and the elements 19,20 of etching agent are dissociated under the effect of the ion beam and create a cloud of reactive elements 19, 20, 21 in the active area 22. The etching agent 23 is continuously pumped to the vicinity of the semiconductor device 2 surface during the whole etching process to assist in uniform etching.

Figure 7:
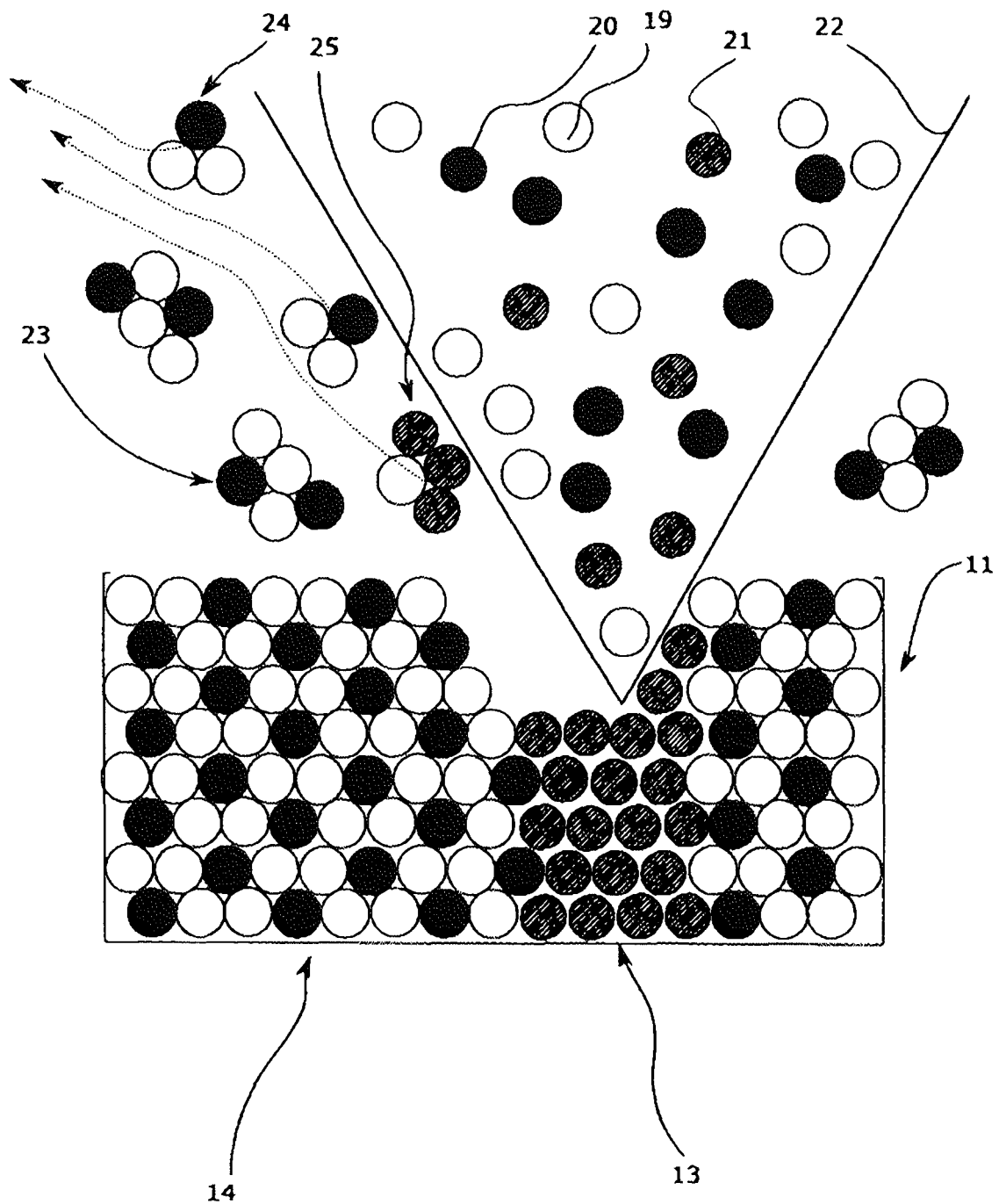
FIG. 7 is a cross-sectional view showing schematically a detail of a portion of the semiconductor device with active high energy ion beam while scanning

FIG. 7 shows the ongoing etching process under a high energy ion beam etching a larger quantity of material (both dielectric 14 and metal conductor 13). The elements (19, 20, 21) from both the metal layer 11 and the etching agent 23 can be found dissociated in the active area 22 of the ion beam. These dissociated elements 19, 20, 21 either go on to associate with each other to form persistent volatile molecules 24, 25 formed due to the combination of metal 21 oxidizing 19 elements or the reducing 20 and oxidizing 19 elements are evacuated due to their volatile nature. The etching agent 23 adsorbed on the metal layer 11 surface or close to the surface is present throughout the progress of planar etch and enters the active area 22 at every step of ion beam movement. In the preferred embodiment, the abundance of etching agent 23 evenly spread over the complete surface of the semiconductor device 2 is of the utmost importance. The presence of etching agent 23 with an appropriate amount of oxidizing and reducing elements is imperative for forming the volatile molecules 24, 25 which can be evacuated instead of redeposited on the surface to promote metal conductor 13 and dielectric 14 etching with the same etching rates and the creation of the smooth planar surface 16.

Figure 8:
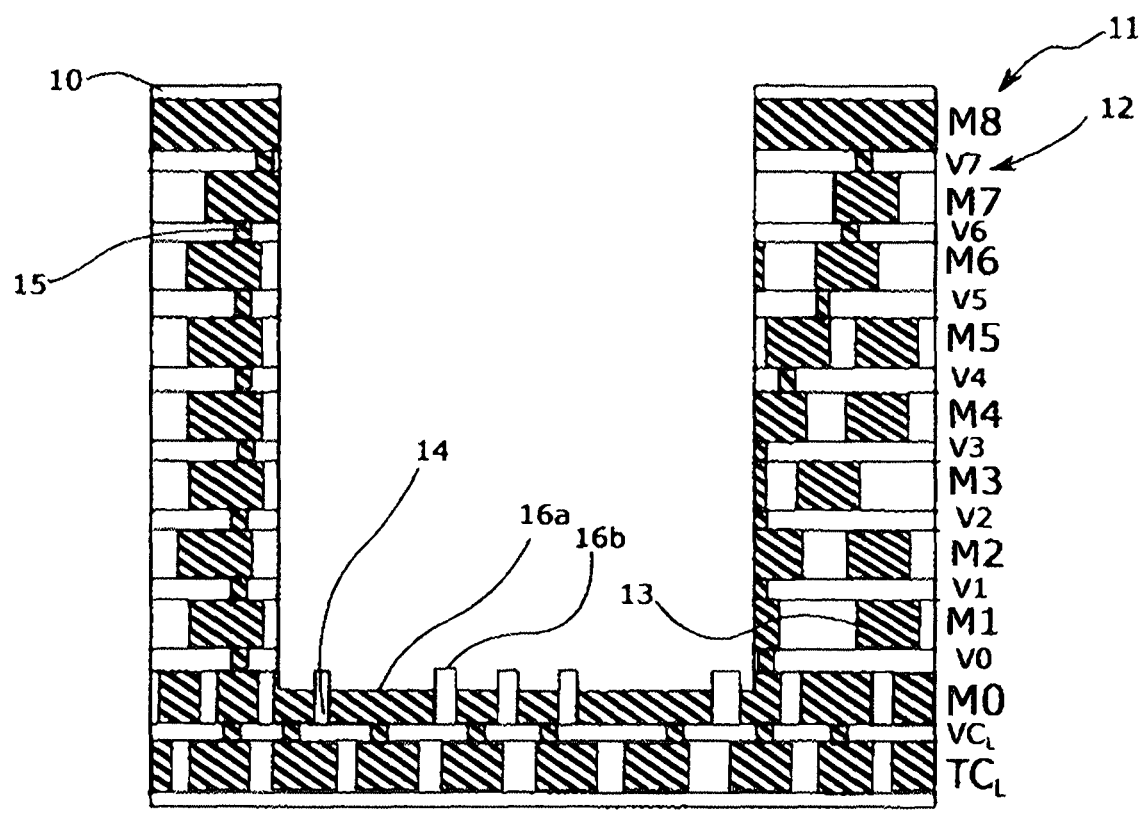
FIG. 8 is a cross-sectional view showing schematically a detail of a portion of the semiconductor device after unsuccessful etching using the etching agent.

FIG. 8 shows the result of unsuccessful planar etching using gas-assisted etching of the high density metal layer M0. A portion of metal layers 11 from M8 to M1 and the via layers 12 from V7 to V0 is removed within a defined area and surface 16a, 16b is created in the metal layer 11 M0. The dielectric 14 has a lower etching rate than the metal 16 in M0 which is a layer with a high metal density and ion beam etching produces a rough surface in this layer. To adjust the dissimilar etching rate a second etching agent 23 needs to be supplied and creates a mixture with the first etching agent 23. If the metal 13 has a higher etching rate compared to dielectric 14, a second etching agent comprising more reducing 20 elements needs to be supplied. In the preferred embodiment, the etching gas is Methyl Carbamate with a 2:3 ratio of reducing 20 to oxidizing 19 elements. In alternative embodiments, Ammonium ethanoate, Chloroacetamide, Fluoroacetamide, N-Nitrosodiethylamine can be used as the first etching agent.

The number of oxidizing agents in the second etching agent is at most one element lower than the number reducing elements 20 in second the etching agent 23. If the metal 12 has lower etching rate compare to dielectric 14 the second etching agent comprises more oxidizing 19 elements needs to be supplied.

The number of oxidizing agents in the second etching agent is at most three elements higher than the number reducing elements 20 in second the etching agent 23.

Figure 9:
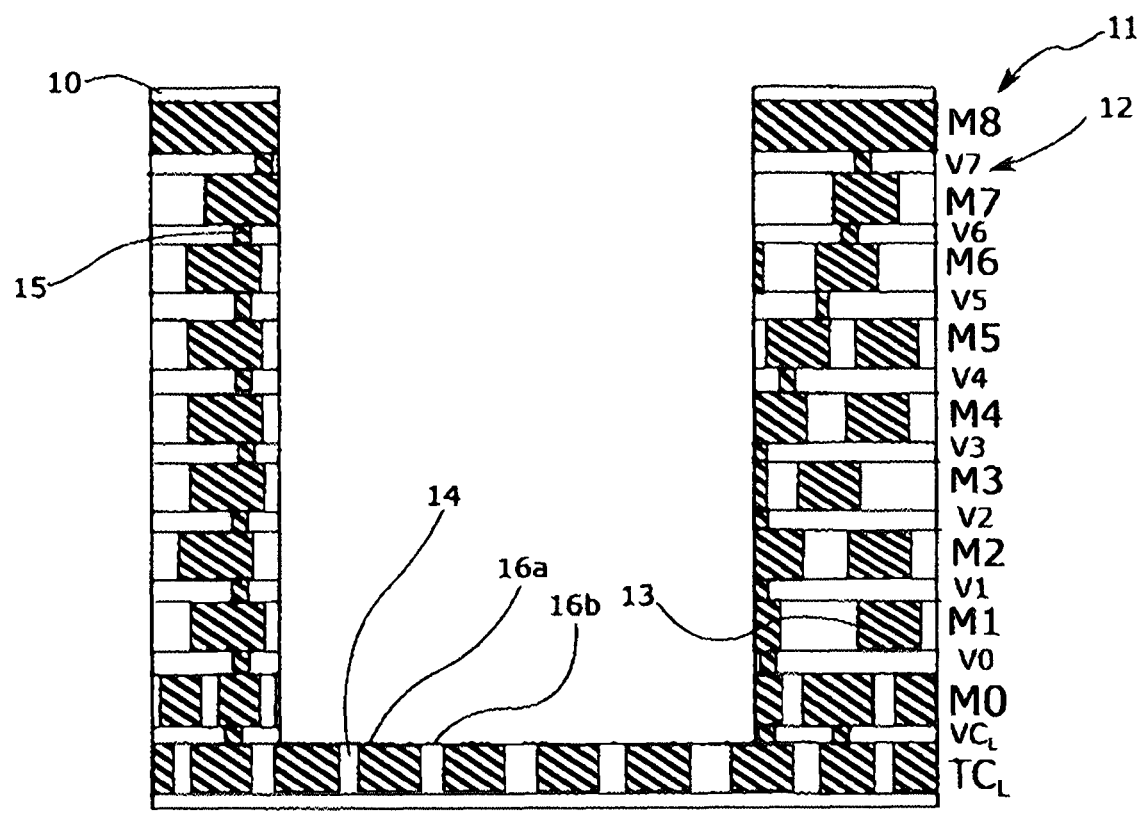
FIG. 9 is a cross-sectional view showing schematically a portion of the semiconductor device after successful etching using combination of the etching agent and the another etching agent.

In the preferred embodiments this second etching agent may be selected from the group comprise Ethyl Formate (o−r=−1), Diethyl Imidodicarbonate (o−r=−1), Acetic Acid (o−r=0), Hydrazine Acetate (o−r=2), water (o−r=1) or Ammonium Bicarbonate (o−r=3). The second etching agent is supplied until the same level of surface 16a and 16b is reached as shown in FIG. 9.

Figure 10:
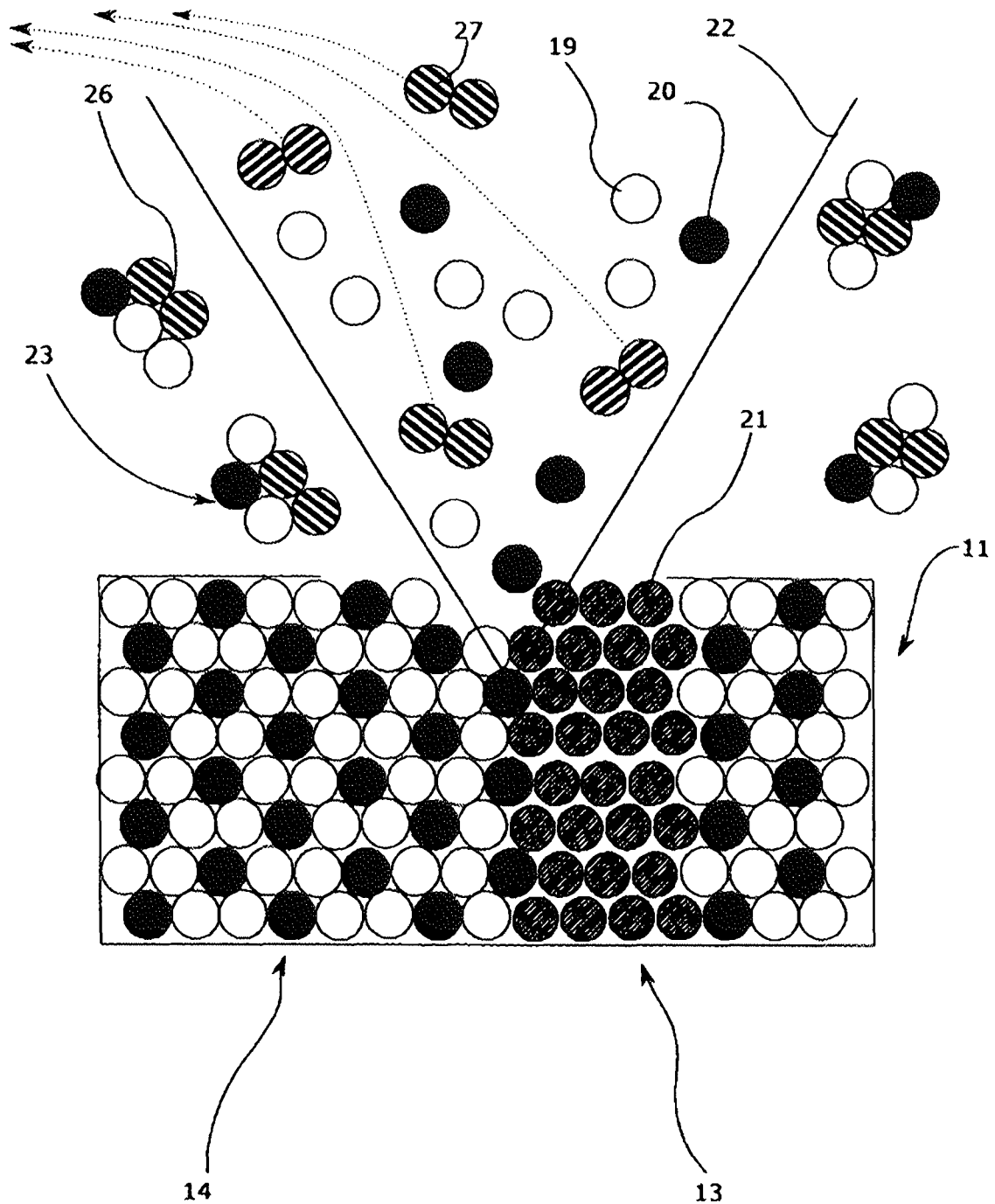
FIG. 10 is a cross-sectional view showing schematically a portion of the semiconductor device with active low energy ion beam

FIG. 10 is a detailed cross-section of one metal layer 11 of semiconductor device 2 about to undergo etching, including dielectric 14 comprising oxidizing 19 and reducing 20 elements, metal conductor 13 comprising metal elements 21. Compared to FIG. 5, the energy of the ion beam is low, below 5 keV; which is not sufficient to bream strong inter-elemental bonds, it produces fewer high reactive fragments and the lower ion beam energy does not allow ion beam ions to penetrate deep into the metal layer 11. This results in slower material removal from metal layer 11. This feature is especially important in high sensitivity layers in semiconductor device 2. A portion of the etching agent 23 comprises reducing 20 elements and oxidizing 19 elements which have C—O 26 elements with double covalent bond in their structure. Etching agent 23 introduced to the surface does not undergo complete dissociation and the non-dissociated volatile fragments 27 are evacuated from the system without reacting with any of the sputtered elements (19, 20, 21) present in the active area 22 of the ion beam.

Figure 11:
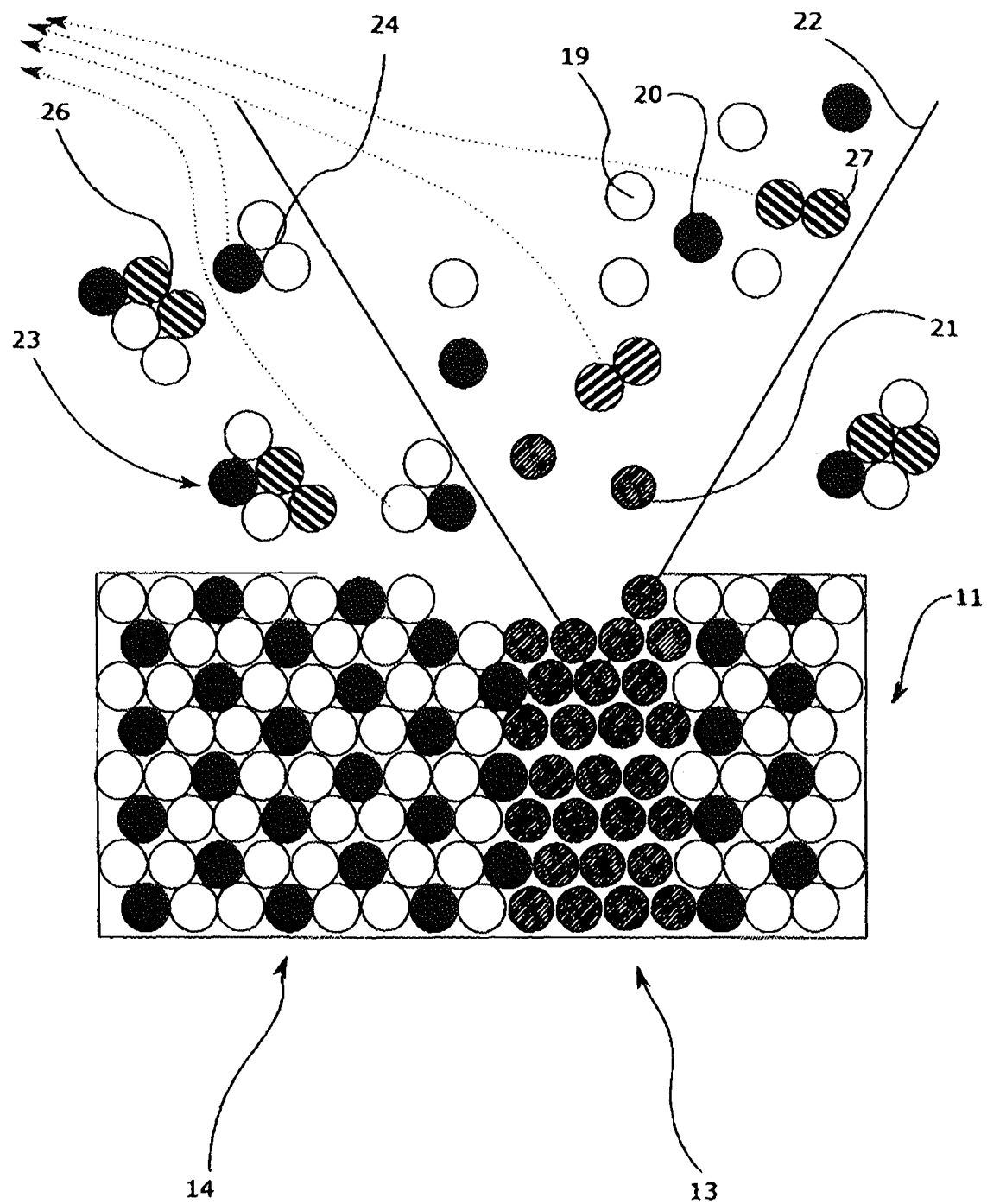
FIG. 11 is a cross-sectional view showing schematically a portion of the semiconductor device with active low energy ion beam while scanning

FIG. 11, in comparison to FIG. 10 shows the situation where the ion beam is scanned over the surface of metal layer 11 while etching the low-k dielectric 14 and metal conductor 13 present in metal layer 11 of semiconductor device 2 with a low energy ion beam. The non-dissociated volatile fragments 27 are continuously evacuated. On the other hand, the dissociated elements 19, 20, 21 either go on to associate with each other to form persistent volatile molecules 24 formed due to the combination of metals reducing 21-oxidizing 19 elements or reducing 20-oxidizing 19 elements are evacuated due to their volatile nature. The depth of etching with <5 keV ion beam and the etching agent is in few tens of nanometers and the freshly etched area has minimal amount of redeposition. The uniformity in etching still holds and the surface is planar and smooth with topographical roughness less than 10 nm in case of layers of very high sensitivity like transistor contact layers $TC_L$.

The invention claimed is:

1. A method of etching one or more of mixed metal and dielectric layer, from an area on a semiconductor device, the method comprising:
    defining the area on the semiconductor device to be etched, the area including at least several layers comprised of mixed metal and dielectric combined in the semiconductor device;
    directing a first etching agent toward the defined area on the semiconductor device, wherein the first etching agent comprises a core structure, —C—O—O—, —C(=O)—O—, —C—O—N—, —C(=O)—N—, —C—N—N— or —C(N)—N— and further comprises an oxidizing element selected from a group of fluorine, chlorine, oxygen, nitrogen and reducing elements which are carbon in ratio, wherein a quantity of the oxidizing elements is one element more than a quantity of the reducing elements and the quantity of reducing elements is at most three; and
    directing an ion beam toward the defined area on the semiconductor device in a presence of the first etching agent, thereby removing at least a portion of the mixed metal and dielectric layers and producing a recess with at least one substantially smooth and planar surface in a milled area on an object.

2. The method according to claim 1, wherein in the first etching agent, the quantity of oxidizing elements is three.

3. The method according to claim 1, wherein the first etching agent is selected from a group of: Ammonium ethanoate, Chloroacetamide, Fluoroacetamide, Methyl Carbamate, and N-Nitrosodiethylamine.

4. The method according to claim 1, wherein a second etching agent is directed toward the defined area on the semiconductor device and the second etching agent comprises oxidizing elements selected from a group of fluorine, chlorine, oxygen, nitrogen and a reducing element which is carbon and the quantity of oxidizing elements in the second etching agent is at least one.

5. The method according to claim 4, wherein the quantity of oxidizing elements in the second etching agent minus the quantity of reducing elements in the second etching agent equals to a number in a range from minus one to three.

6. The method according to claim 4, wherein the second etching agent is selected from a group of: Acetic Acid, Ethyl Formate, Ammonium Bicarbonate, Hydrazine Acetate, and Diethyl Imfdodicarbonate.

7. The method according to claim 1, wherein a dielectric in the semiconductor device is a low-k dielectric.

8. The method according to claim 1, wherein a dielectric in the semiconductor device comprises at least one of: $SixNy$ or $SixOy$.

9. The method according to claim 1, wherein the substantially smooth and planar surface is parallel to the metal or dielectric layers of the semiconductor device.

10. The method according to claim 1, wherein the substantially smooth and planar surface is offset to the metal or dielectric layers of the semiconductor device at an angle in range 10-170*.

11. The method according to claim 1, wherein the ion beam is a focused ion beam.

12. A method of etching one or more of mixed metal and dielectric layer, from an area on a semiconductor device, the method comprising:
    defining the area on the semiconductor device to be etched, the area including at least several layers comprised of mixed metal and dielectric combined in the semiconductor device;
    directing a first etching agent toward the defined area on the semiconductor device, wherein the first etching agent comprises a core structure —COO—, —CON—, or —CNN— and further comprises an oxidizing element selected from a group of fluorine, chlorine, oxygen, nitrogen and reducing elements which are carbon in ration, wherein a quantity of the oxidizing elements is one element more than a quantity of the reducing elements and the quantity of reducing elements is at most three; and
    directing an ion beam toward the defined area on the semiconductor device in a presence of the first etching agent, thereby removing at least a portion of the mixed metal and dielectric layers and producing a recess with at least one substantially smooth and planar surface in a milled area on an object,
    wherein etching the defined area of the semiconductor device with the first etching agent comprises:
    a first etching step wherein at least a portion of the mixed metal and dielectric layers is etched with a first beam of energy, and
    a second etching step wherein the portion of the mixed metal and dielectric layers etched in the first etching step is fine etched using a second beam of energy, wherein the first beam of energy is higher than the second beam of energy.

13. The method according to claim 12, wherein the fine etching is used for etching at least a portion of high metal density layers from a M1 to transistor contact layer.

* * * * *